(12) United States Patent
Miura (10) Patent No.: US 10,276,732 B2
(45) Date of Patent: Apr. 30, 2019

(54) SOLAR CELL ELEMENT AND METHOD OF MANUFACTURING SOLAR CELL ELEMENT

(71) Applicant: KYOCERA CORPORATION, Kyoto (JP)

(72) Inventor: Yoshio Miura, Higashiomi (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 15/820,153

(22) Filed: Nov. 21, 2017

(65) Prior Publication Data

US 2018/0102441 A1    Apr. 12, 2018

Related U.S. Application Data

(63) Continuation of application No. PCT/JP2016/065772, filed on May 27, 2016.

(51) Int. Cl.
| | |
|---|---|
| *H01L 31/0216* | (2014.01) |
| *H01L 31/18* | (2006.01) |
| *H01L 31/068* | (2012.01) |
| *H01L 31/0236* | (2006.01) |
| *H01L 31/0224* | (2006.01) |

(52) U.S. Cl.
CPC .. *H01L 31/02167* (2013.01); *H01L 31/02168* (2013.01); *H01L 31/02363* (2013.01); *H01L 31/068* (2013.01); *H01L 31/1868* (2013.01); H01L 31/022425 (2013.01); H01L 31/0682 (2013.01); Y02E 10/50 (2013.01); Y02P 70/521 (2015.11)

(58) Field of Classification Search
CPC ........... H01L 31/02167; H01L 31/0216; H01L 31/068; H01L 31/1868
USPC .......................................................... 136/256
See application file for complete search history.

(56) References Cited

U.S. PATENT DOCUMENTS

| | | | |
|---|---|---|---|
| 8,557,718 B2 | 10/2013 | Vermang | |
| 8,796,543 B2* | 8/2014 | Suzuki | B82Y 10/00 136/263 |
| 8,933,525 B2 | 1/2015 | Engelhart et al. | |
| 2003/0214051 A1* | 11/2003 | Dent | H01L 23/5329 257/779 |
| 2004/0112426 A1 | 6/2004 | Hagino | |
| 2007/0295388 A1 | 12/2007 | Adriani et al. | |

(Continued)

FOREIGN PATENT DOCUMENTS

| | | |
|---|---|---|
| CN | 1863882 A | 11/2006 |
| CN | 103503121 A | 1/2014 |

(Continued)

OTHER PUBLICATIONS

International Search Report/Written Opinion dated Aug. 16, 2016, in corresponding International Application No. PCT/JP2016/065772 with Statement of Relevance of Non-English References.

*Primary Examiner* — Jayne L Mershon
(74) *Attorney, Agent, or Firm* — Duane Morris LLP (57) ABSTRACT

A solar cell element includes a semiconductor substrate, a passivation layer and a protective layer. The semiconductor substrate includes a p-type semiconductor region on one surface side thereof. The passivation layer is located on the p-type semiconductor region and contains aluminum oxide. The protective layer is located on the passivation layer and includes polysiloxane layer which contains an alkyl group.

14 Claims, 7 Drawing Sheets

(56) References Cited

U.S. PATENT DOCUMENTS

| | | |
|---|---|---|
| 2009/0165855 A1 | 7/2009 | Sun et al. |
| 2011/0114148 A1* | 5/2011 | Temchenko ............ B32B 15/08 |
| | | 136/244 |
| 2012/0174960 A1 | 7/2012 | Hashigami et al. |
| 2015/0255638 A1* | 9/2015 | Karkkainen ........ H01L 31/0547 |
| | | 136/256 |

FOREIGN PATENT DOCUMENTS

| | | |
|---|---|---|
| CN | 104037243 A | 9/2014 |
| JP | 2004-193350 A | 7/2004 |
| JP | 2009-164544 A | 7/2009 |
| JP | 2012-530361 A | 11/2012 |
| JP | 2012-253356 A | 12/2012 |
| WO | 2011/033826 A1 | 3/2011 |
| WO | 2014/044924 A1 | 3/2014 |

* cited by examiner

SOLAR CELL ELEMENT AND METHOD OF MANUFACTURING SOLAR CELL ELEMENT

CROSS-REFERENCE TO RELATED APPLICATION

The present application is a continuation based on PCT Application No. PCT/JP2016/065772 filed on May 27, 2016, which claims the benefit of Japanese Application No. 2015-107736, filed May 27, 2015. PCT Application No. PCT/JP2016/065772 is entitled "SOLAR CELL ELEMENT AND METHOD FOR MANUFACTURING SAME", and Japanese Application No. 2015-107736 is entitled "SOLAR CELL ELEMENT AND METHOD FOR MANUFACTURING SAME". The contents of which are incorporated by reference herein in their entirety.

FIELD

Embodiments of the present disclosure relate generally to a solar cell element (a solar cell) and a method of manufacturing the solar cell element.

BACKGROUND

A semiconductor substrate made of silicon is used as a photoelectric conversion material in a general crystalline solar cell element. The semiconductor substrate includes a passivation layer on a surface thereof. The passivation layer is formed of aluminum oxide, for example. Properties of aluminum oxide easily change due to a penetration of moisture. Thus, performed is a formation of a protective layer of oxide or nitride by a plasma enhanced chemical vapor deposition (PECVD), for example, on the passivation layer.

SUMMARY

A solar cell element and a method of manufacturing a solar cell element are disclosed. In one embodiment, a solar cell element includes a semiconductor substrate, a passivation layer and a protective layer. The semiconductor substrate includes a p-type semiconductor region on one surface side thereof. The passivation layer is located on the p-type semiconductor region and contains aluminum oxide. The protective layer is located on the passivation layer and includes a polysiloxane layer which contains an alkyl group.

In one embodiment, a method of manufacturing a solar cell element includes forming a passivation layer on a p-type semiconductor region of a semiconductor substrate, forming a coating film on the passivation layer and drying the coating film to form a protective layer. The passivation layer includes aluminum oxide. The semiconductor substrate includes the p-type semiconductor region on one surface side thereof. The coating film includes polysiloxane. The protective layer includes a polysiloxane layer containing an alkyl group.

DETAILED DESCRIPTION

When a protective layer located on a passivation layer which constitutes a solar cell element is formed by PECVD or the like, the passivation layer is deteriorated by an influence of heat and plasma in some cases. In the above case, a function of the passivation layer reduces, thus a photoelectric conversion efficiency of the solar cell element may reduce. Required therefore are a solar cell element capable of maintaining high photoelectric conversion efficiency and a method of manufacturing the same.

Embodiments of the solar cell element and the method of manufacturing the solar cell element are described in detail with reference to drawings. Drawings are schematically illustrated.

<Solar Cell Element>

Figure 1:
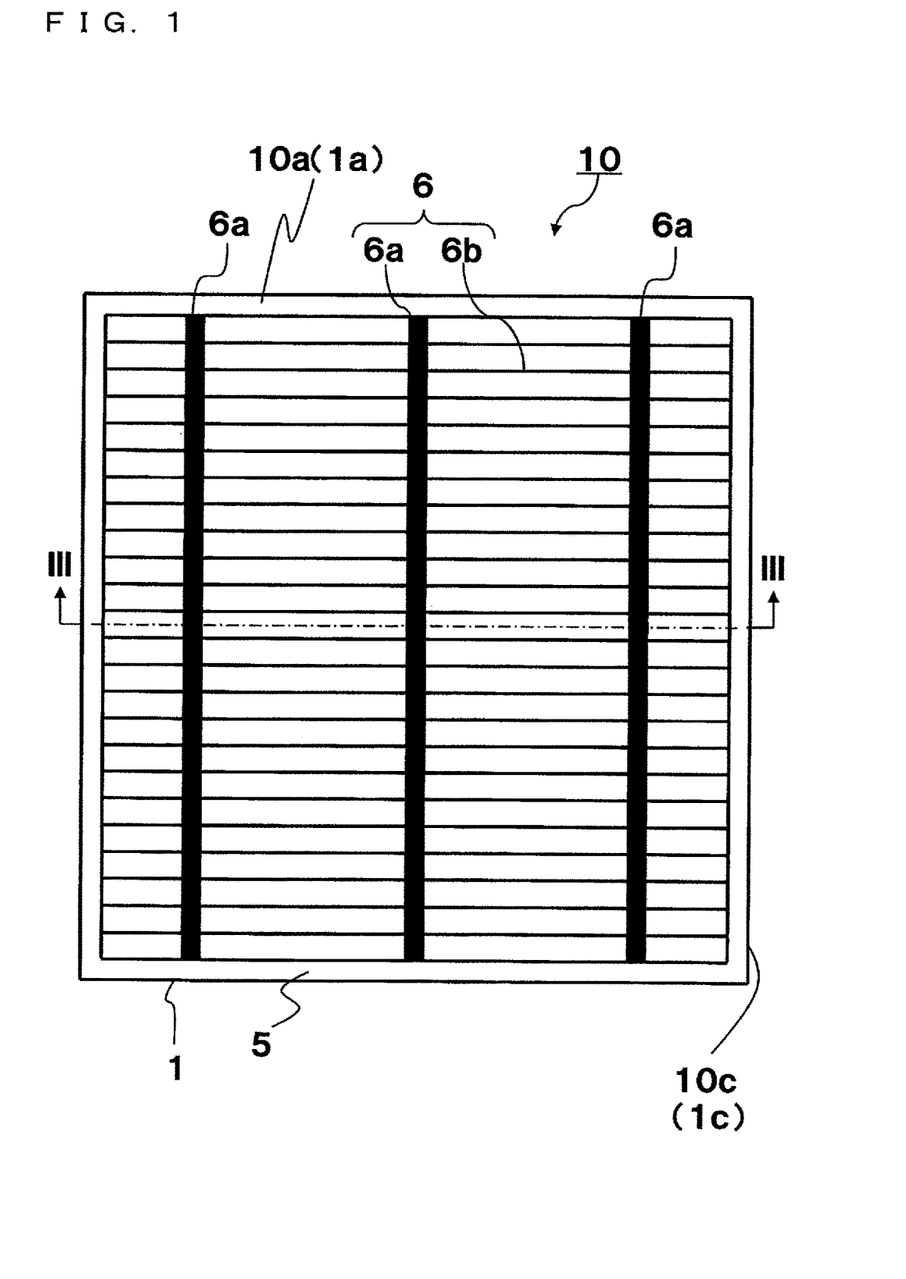
FIG. 1 illustrates a planar view showing an appearance of a first surface side of a solar cell element.
Figure 2:
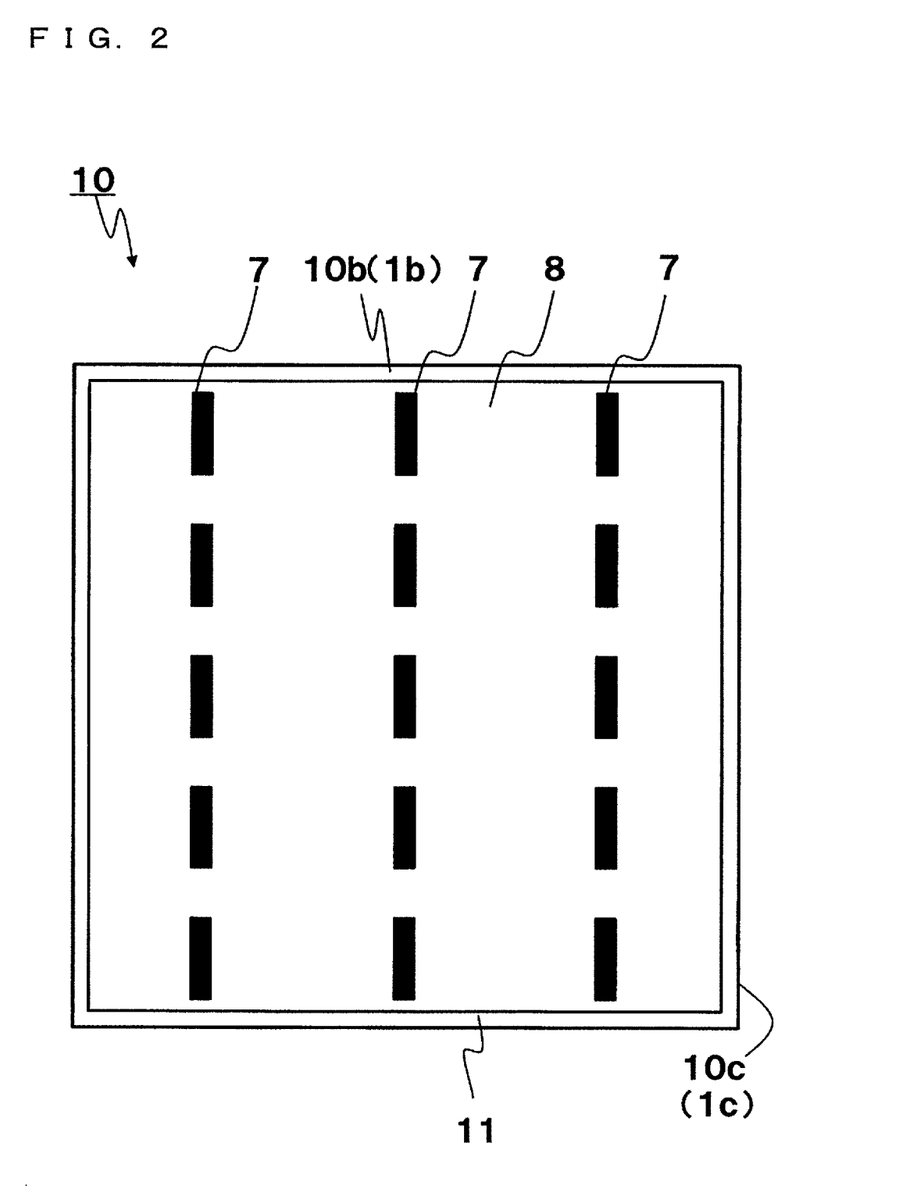
FIG. 2 illustrates a planar view showing an appearance of a second surface side of the solar cell element.
Figure 3:
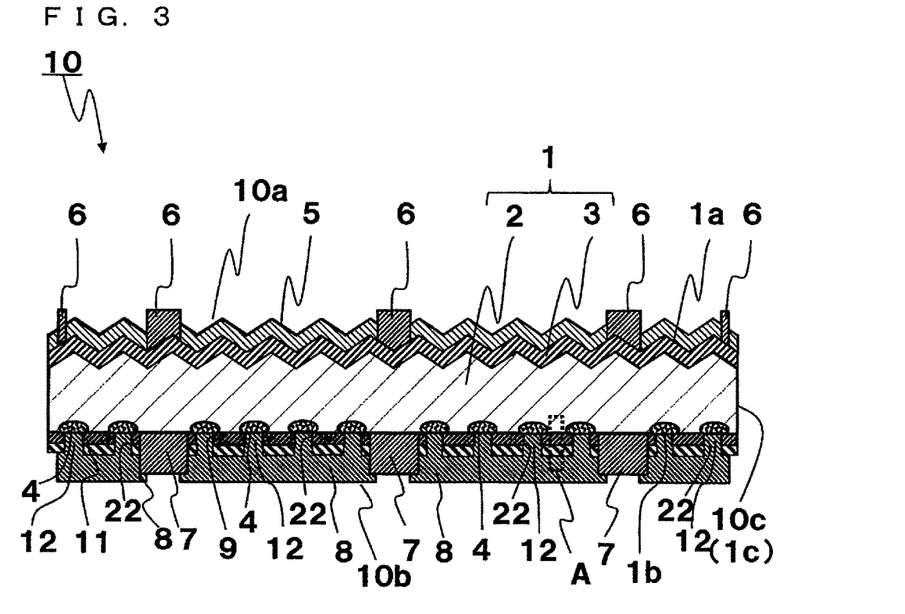
FIG. 3 illustrates a cross-sectional view showing a cross section along a line in FIG. 1.

FIG. 1 to FIG. 3 illustrate a solar cell element 10. As illustrated in FIG. 3, the solar cell element 10 includes a first surface 10a which is an acceptance surface from which light enters mainly, a second surface 10b which is a surface (back surface) located on opposite side of the first surface 10a, and a side surface 10c. The solar cell element 10 also includes a silicon substrate (referred to as the substrate hereinafter) 1 as a semiconductor substrate. The substrate 1 also has the first surface 1a, the second surface 1b located on opposite side of the first surface 1a, and the side surface 1c. The substrate 1 includes a first semiconductor layer 2 which is a semiconductor region of one conductive type (p-type, for example) and a second semiconductor layer 3 which is a semiconductor region of reverse conductive type (n-type, for example) located on the first surface 10a side of the first semiconductor layer 2. The solar cell element 10 further includes a back surface field (BSF) layer 4, an antireflection layer 5, a first electrode 6, a second electrode 7, a third electrode 8, a passivation layer 9, and a protective layer 11.

The substrate 1 is a monocrystalline or polycrystalline silicon substrate, for example, and includes the first semiconductor layer 2 and the second semiconductor layer 3 located on the first surface 1a side of the first semiconductor layer 2. Since the substrate 1 may be a semiconductor substrate including the first semiconductor layer 2 and the second semiconductor layer 3, a semiconductor substrate made of germanium, selenium, or gallium arsenic, for example, may be applied to the substrate 1.

An example of using a p-type semiconductor as the first semiconductor layer 2 is described hereinafter. When the p-type semiconductor is used as the first semiconductor layer 2, a p-type silicon substrate, for example, is used as the substrate 1. When a polycrystalline or monocrystalline silicon substrate is used as the substrate 1, a thickness thereof is set to approximately 100 to 250 μm, for example. Although a shape of the substrate 1 is not particularly limited, the substrate 1 having a substantial square shape in a planar view is preferable by reason that when a solar cell module is manufactured from the solar cell elements 10, a space between the elements can be reduced. When the first semiconductor layer 2 made up of the polycrystalline substrate 1 is the p-type semiconductor, an impurity such as boron, gallium, or the like is contained as a dopant.

The second semiconductor layer 3 is laminated on the first semiconductor layer 2. The second semiconductor layer 3 therefore includes a pn junction part at an interface between the second semiconductor layer 3 and the first semiconductor layer 2. The second semiconductor layer 3 is the semiconductor layer of reverse conductive type with respect to the first semiconductor layer 2 (the n-type in an embodiment), and is located on the first surface 1*a* side of the first semiconductor layer 2. In the substrate 1 including the first semiconductor layer 2 of p conductive type, the second semiconductor layer 3 can be formed by diffusing an impurity such as phosphorus as a dopant on the first surface 1*a* side, for example.

As illustrated in FIG. 3, a minute concave-convex structure (a texture) for reducing a reflection ratio of the emitted light may be provided on the first surface 1*a* side of the substrate 1. A convex portion of the texture has a height of approximately 0.1 to 10 µm, and a distance between the adjacent convex portions is approximately 0.1 to 20 µm. In the texture, for example, the concave portion may have a substantial spherical shape, and the convex portion may have a pyramidal shape. "The height of the convex portion" described above indicates a distance from a reference line, which is a straight line passing through a bottom surface of the concave portion, to a top surface of the convex portion in a direction vertical to the reference line in FIG. 3, for example. "The distance between the convex portions" indicates a distance between centers of the top surfaces of the adjacent convex portions in a direction parallel to the reference line.

The antireflection layer 5 has a function of reducing the reflection ratio of the light emitted to the first surface 10*a* of the solar cell element 10. The antireflection layer 5 is made of silicon oxide, aluminum oxide, or a silicon nitride layer, for example. It is applicable to appropriately adopt, as a refraction index and thickness of the antireflection layer 5, a refraction index and thickness capable of achieving a low reflection condition on sunlight within a wavelength range in which the sunlight is absorbed in the substrate 1, thereby being able to contribute to a power generation. For example, the antireflection layer 5 may have the refraction index of approximately 1.8 to 2.5 and the thickness of approximately 20 to 120 nm.

The BSF layer 4 may be located on a side of the second surface 1*b* in the substrate 1 and have the same conductive type as the first semiconductor layer 2 (the p-type in an embodiment). The concentration of the dopant contained in the BSF layer 4 is higher than that of the dopant contained in the first semiconductor layer 2. The BSF layer 4 contains the dopant at a concentration higher than that of the dopant doped to cause the first semiconductor layer 2 to have one conductive type. The BSF layer 4 forms an internal electric field on the second surface 1*b* side in the substrate 1. Thus, a recombination of minority carriers hardly occurs near the surface of the second surface 1*b* in the substrate 1, and a reduction in the photoelectric conversion efficiency can be reduced. The BSF layer 4 can be formed by diffusing the dopant such as boron or aluminum on the second surface 1*b* side in the substrate 1, for example. The concentration of the dopant contained in the first semiconductor layer 2 and the BSF layer 4 may be approximately $5 \times 10^{15}$ to $1 \times 10^{17}$ atoms/$cm^3$, $1 \times 10^{18}$ to $5 \times 10^{21}$ atoms/$cm^3$, respectively. The BSF layer 4 may be located in a portion where a third electrode 8 described hereinafter is in contact with the substrate 1.

The first electrode 6 is an electrode located on the first surface 1*a* side of the substrate 1. The first electrode 6 includes a first output extraction electrode 6*a* and a plurality of first power collection electrodes 6*b* having a linear shape as illustrated in FIG. 1. The first output extraction electrode 6*a* is an electrode for taking out electricity obtained by power generation to outside and has a length of approximately 0.5 to 2.5 mm in a short-side direction (referred to as the width hereinafter), for example. At least part of the first output extraction electrode 6*a* intersects with the first power collection electrodes 6*b* to be electrically connected to the first power collection electrodes 6*b*. The first power collection electrodes 6*b* are electrodes for collecting electricity generated in the substrate 1. Each of the first power collection electrodes 6*b* has a linear shape, and has a width of approximately 50 to 200 µm, for example. As described above, the width of the first power collection electrode 6*b* is smaller than that of the first output extraction electrode 6*a*. The plurality of the first power collection electrodes 6*b* are disposed with a space of approximately 1 to 3 mm therebetween. The first electrode 6 has a thickness of approximately 10 to 40 µm. Such a first electrode 6 can be formed by applying a first metal paste which mainly contains silver to have a desired shape by a screen printing or the like, and subsequently baking it, for example. A term of "mainly contain . . . " in an embodiment indicates that a content mass with respect to the whole constituent is equal to or larger than 50% by mass.

The second electrode 7 and the third electrode 8 are electrodes located on the second surface 1*b* side of the substrate 1 as illustrated in FIG. 2 and FIG. 3. The second electrode 7 is an electrode for taking out the electricity obtained by the power generation in the solar cell element 10 to outside. The second electrode 7 is formed on the passivation layer 9 or the protective layer 11, or passes through the passivation layer 9 and the protective layer 11, thereby being formed on the substrate 1. The second electrode 7 may include dots (or islands) linearly disposed as illustrated in FIG. 2, or may also disposed to have a band-like shape (or a linear shape). The second electrode 7 has a thickness of approximately 10 to 30 µm and has a width of approximately 1.3 to 7 min. The second electrode 7 mainly contains silver. Such a second electrode 7 can be formed by applying a metal paste which mainly contains silver to have a desired shape by a screen printing or the like, and subsequently baking it, for example.

As illustrated in FIG. 2 and FIG. 3, the third electrode 8 is an electrode for collecting electricity generated in the substrate 1 on the second surface 1*b* of the substrate 1 and is disposed to be electrically connected to the second electrode 7. Herein, at least part of the second electrode 7 needs to be connected to the third electrode 8. Part of the third electrode 8 fills a large number of holes 22 passing through the passivation layer 9 and the protective layer 11, thereby being connected to the first semiconductor layer 2 in the substrate 1. The third electrode 8 is formed to cover substantially an entire surface of the protective layer 11 except for an outer peripheral portion ranging approximately 0.3 to 2 mm from an end portion of the substrate 1. The third electrode 8 mainly contains aluminum. The third electrode 8 has a thickness of approximately 15 to 50 µm, and can be formed by applying a metal paste which mainly contains aluminum to have a desired shape and subsequently baking it, for example.

The passivation layer 9 is formed on at least the first semiconductor layer 2 which is the p-type semiconductor region in the substrate 1, and has a function of reducing a recombination of minority carriers. Preferably used as the passivation layer 9a is a film which is formed by an atomic layer deposition (ALD) method, for example, and contains aluminum oxide. The passivation layer 9 may have more than one layer. The passivation layer 9 has a thickness of approximately 10 to 200 nm. A film having a strong negative fixed charge such as aluminum oxide is used as the passivation layer 9, thus the minority carriers (electrons in this case) are kept away from the interface between the substrate 1 and the passivation layer 9 due to an electrical field effect. Thus, the recombination of the minority carriers can be further reduced.

The protective layer 11 is located on the passivation layer 9 containing aluminum oxide. The above configuration can achieve the solar cell element 1 having an excellent reliability in moisture resistance, for example. The protective layer 11 further includes a polysiloxane layer which contains an alkyl group having a molecular weight of approximately 5 to $10 \times 10^5$, for example. In the polysiloxane layer containing the alkyl group, the alkyl group such as a methyl group ($CH_3$) or an ethyl group ($C_2H_5$) binds to a structure having a large number of siloxane bonds of Si—O—Si. The protective layer 11 which includes the polysiloxane layer containing the alkyl group can be formed by applying polysiloxane oligomer on the passivation layer 9, and subsequently drying and hardening it.

Since the polysiloxane layer contains the alkyl group, the protective layer 11 has the structure that there is low amount of polarization charge on a surface of the polysiloxane layer. The protective layer 11 therefore has water repellency, thus water molecules hardly pass through the protective layer 11. The protective layer 11 having a thickness of approximately 0.1 to 10 μm (or 1 to 5 μm) enables an achievement of the solar cell element 10 having the excellent reliability in the moisture resistance, for example. The configuration that the protective layer 11 includes the polysiloxane layer having the alkyl group can be detected by time of flight secondary ion mass spectrometry (TOF-SIMS) or Fourier transform infrared spectroscopy (FT-IR), for example.

Figure 4:
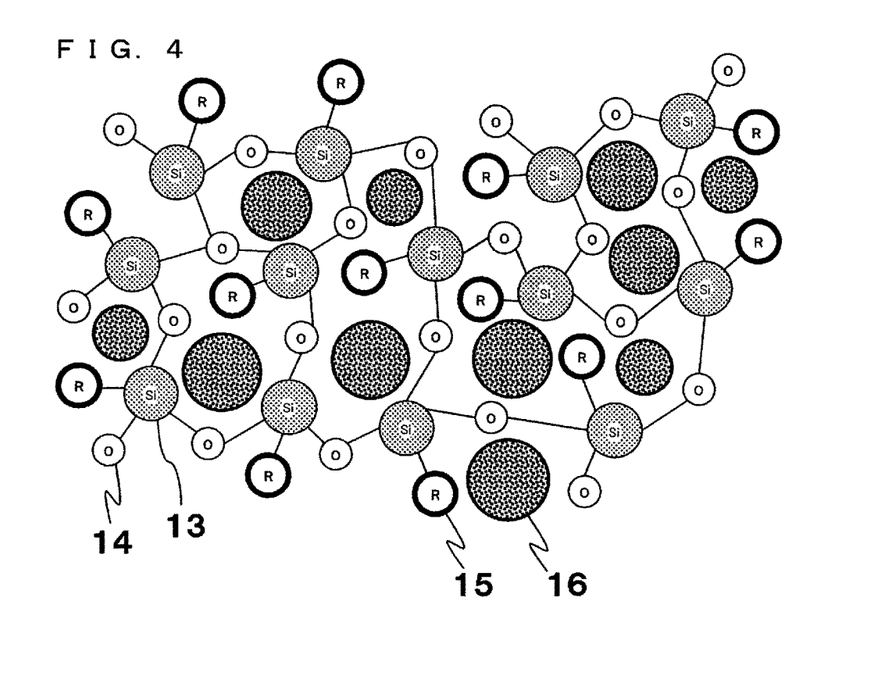
FIG. 4 illustrates a structure diagram showing a structure of a polysiloxane layer.

It is preferable that the protective layer 11 includes the polysiloxane layer containing the alkyl group (simply referred to as the polysiloxane layer hereinafter) in which silica particles 16 containing a plurality of silicon atoms are dispersedly contained. As illustrated in FIG. 4, the polysiloxane layer has a steric structure made of silicon atoms 13, oxygen atoms 14, and alkyl groups 15. A region surrounded by those atoms and alkyl groups include the silica particles 16 containing the plurality of silicon atoms such as colloidal silica, for example. Herein, an average particle diameter of the silica particles 16 may be approximately 20 to 200 run. Since the polysiloxane layer includes the silica particles 16 containing the plurality of silicon atoms, moisture transmission of the protective layer 11 can be further reduced, and the reliability of the solar cell element 10 can be further enhanced. The configuration that the polysiloxane layer dispersedly includes the silica particles 16 containing the plurality of silicon atoms can be detected by TOF-SIMS, for example.

The protective layer 11 may contain at least one of a carboxyl group (COOH) and a carbonate group ($CO_3$) in the polysiloxane layer. Part of the alkyl group in the polysiloxane layer oxidizes, thus at least one of the carboxyl group and the carbonate group is generated. In an embodiment, a π-electron covalent bond is formed in the polysiloxane layer, thus the polysiloxane layer has the negative fixed charge in a manner similar to the passivation layer 9 containing aluminum oxide. Thus, the passivation effect in the passivation layer 9 can be further enhanced, and the photoelectric conversion efficiency of the solar cell element 10 can be further enhanced.

The polysiloxane layer containing at least one of the carboxyl group and the carbonate group can be formed by processes described below. A polysiloxane oligomer solution containing the alkyl group is applied on the substrate 1. Subsequently, the substrate 1 on which the polysiloxane oligomer solution is applied is dried at a temperature of approximately 100 to 300° C. for 30 seconds to 20 minutes to be hardened. Subsequently, the substrate 1 is heated at a temperature of approximately 700 to 900° C. for 0.1 to several tens of seconds so that part of the alkyl group in the film is oxidized. According to the above processes, the polysiloxane layer can be formed on the substrate 1. The configuration that the polysiloxane layer contains the carboxyl group or the carbonate group can be detected by X-ray photoelectron spectroscopy (XPS), for example.

<Method of Manufacturing Solar Cell Element>

Next, each process of the method of manufacturing the solar cell element 10 is described.

Figure 5A:
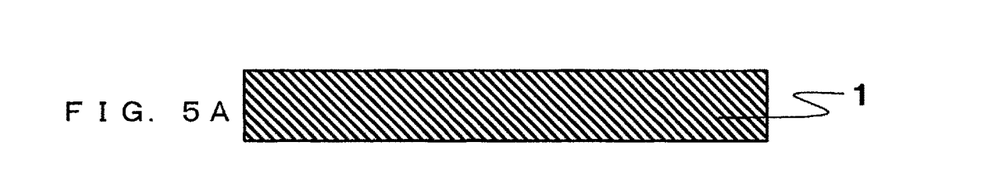
FIGS. 5A to 5I illustrate cross-sectional views each showing an example of a process of a method of manufacturing the solar cell element.

Firstly, the substrate 1 is prepared as illustrated in FIG. 5A. The substrate 1 may be made of a monocrystalline or polycrystalline silicon. The substrate 1 is formed by an existing Czochralski (CZ) method or casting method, for example. Described hereinafter is an example of using the p-type polycrystalline silicon substrate as the substrate 1. For example, an ingot of the polycrystalline silicon is prepared by the casting method. It is sufficient that boron is added as the dopant, for example, so that the ingot has a specific resistance of 1 to 5 Ω·cm. Next, the ingot is sliced to have a square shape having a length of approximately 150 to 160 mm in each side and a thickness of approximately 100 to 200 μm, and the substrate 1 is thereby prepared. Subsequently, the surface of the substrate 1 may be slightly etched with a water solution of NaOH, KOH, hydrofluoric acid, or nitrohydrofluoric acid, for example, so as to remove a mechanical damage layer and clean a contamination layer in a cut surface of the substrate 1.

Figure 5B:
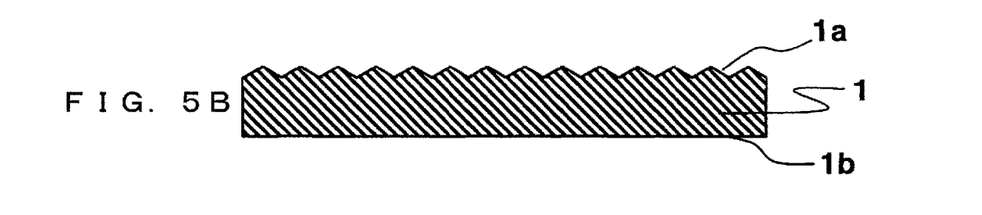

As illustrated in FIG. 5B, a texture may be formed on the first surface 1a of the substrate 1 to reduce a light reflection on the surface thereof. A method of forming the texture includes a wet etching in which an alkali solution of NaOH, for example, or an acid solution of nitrohydrofluoric acid, for example, is used or a dry etching in which a reactive ion etching (RIE) or the like is applied.

Figure 5C:
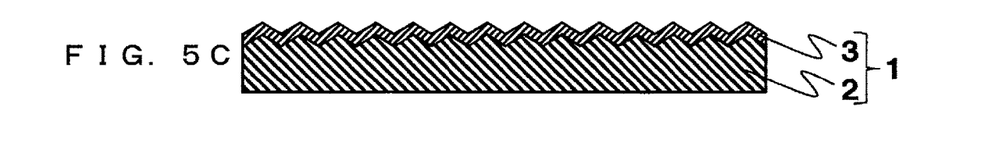

Next, as illustrated in FIG. 5C, the n-type second semiconductor layer 3 is formed on the first surface 1a side of the substrate 1 having the texture. The second semiconductor layer 3 is formed by a coating thermal diffusion method in which diphosphorus pentaoxide ($P_2O_5$) in paste form is applied on the surface of the substrate 1 and is thermally diffused or a gas-phase thermal diffusion method in which phosphorus oxychloride ($POCl_3$) in a form of gas functions as a diffusion source. The second semiconductor layer 3 is formed to have a thickness of approximately 0.1 to 2 μm and a sheet resistance value of approximately 40 to 200Ω/□. For example, in the gas-phase thermal diffusion method, a thermal treatment is performed on the substrate 1 at a temperature of approximately 600 to 800° C. in an atmosphere including a diffusion gas containing $POCl_3$, for example, for approximately 5 to 30 minutes to form a phosphosilicate glass (PSG) on the surface of the substrate 1. Subsequently, a thermal treatment is performed on the substrate 1 at a high temperature of approximately 800 to 900° C. in an inactive gas atmosphere of argon or nitride, for example, for approximately 10 to 40 minutes. Accordingly, phosphorus is diffused from the PSG to the substrate 1, and the second semiconductor layer 3 is thereby formed on the first surface 1a side in the substrate 1.

When the second semiconductor layer 3 is also formed on the second surface 1b side of the substrate 1 in the process of forming the second semiconductor layer 3 described above, only the second semiconductor layer 3 formed on the second surface 1b side is removed by etching. The p-type first semiconductor layer 2 is thereby exposed on the second surface 1b side of the substrate 1. For example, only the second surface 1b side of the substrate 1 is dipped into a mixed solution of hydrofluoric acid and nitric acid to remove the second semiconductor layer 3 formed on the second surface 1b side of the substrate 1. Subsequently, the PSG attached to the first surface 1a of the substrate 1 at the time of forming the second semiconductor layer 3 is etched with hydrofluoric acid and removed. At this time, the second semiconductor layer 3 formed on the side surface 1c of the substrate 1 may also be removed.

According to the above processes, the polycrystalline substrate 1 including the second semiconductor layer 3, which is the n-type semiconductor layer, on the first surface 1a side and having the texture on the surface can be prepared.

Figure 5D:
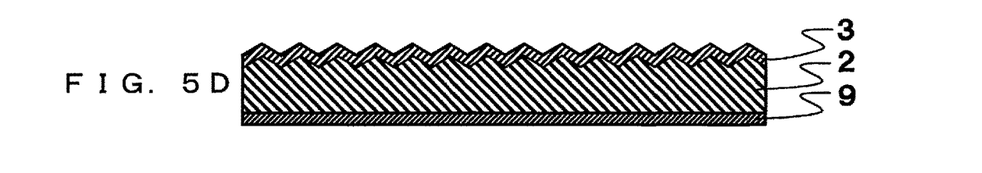

Next, the passivation layer 9 is formed. As illustrated in FIG. 5D, the passivation layer 9 made of aluminum oxide is formed on the second surface 1b of the first semiconductor layer 2. A method of forming the passivation layer 9 may include, for example, an ALD method or a PECVD method. Particularly, the ALD method is preferable by reason that it is superior in terms of coverage of the surface of the substrate 1. Thus, the passivation layer 9 prepared by the ALD method can achieve more increased passivation effect.

In forming the passivation layer 9 by the ALD method, the substrate 1 on which the second semiconductor layer 3 described above is formed is disposed in a chamber of a deposition device. Then, processes A to D are repeated several times in a state where the substrate 1 is heated at a temperature ranging from 100° C. to 250° C. The passivation layer 9 made of aluminum oxide with a desired thickness is thereby formed on the substrate 1. The following is contents of the processes A to D.

[Process A] An aluminum material such as trimethyl aluminum (TMA) for forming aluminum oxide is supplied on the substrate 1 together with a carrier gas such as an argon (Ar) gas or a nitrogen gas. The aluminum material is thereby absorbed onto an entire periphery of the substrate 1. A length of time to supply the TMA may be approximately 15 to 3000 milliseconds, for example.

It is preferable that the surface of the substrate 1 is terminated with an OH group at the time of starting the process A. When the surface of the substrate 1 has a structure of Si—O—H, a covalent bond is easily formed at an interface between the surface of the substrate 1 and the aluminum oxide film formed in the process A. Accordingly, a joint strength between the surface of the substrate 1 and the aluminum oxide film can be enhanced, thus the reliability of the solar cell element 10 can be further enhanced. The structure of Si—O—H can be formed by treating the substrate 1 with dilute hydrofluoric acid and subsequently cleaning the substrate 1 with pure water, for example.

[Process B] An inner portion of the chamber of the deposition device is cleaned by the nitrogen gas, and the aluminum material in the chamber is removed. Moreover, removed is the aluminum material other than a constituent which is chemically absorbed at an atomic layer level in the aluminum material which is physically absorbed and chemically absorbed onto the substrate 1. A length of time to clean the inner portion of the chamber with the nitrogen gas may be approximately 1 to several tens of seconds, for example.

[Process C] An oxidant such as water or ozone gas is supplied in the chamber of the deposition device, thus the alkyl group contained in the TMA is removed and substituted with the OH group. Accordingly, the atomic layer of aluminum oxide is formed on the substrate 1. A length of time to supply the oxidant in the chamber is preferably approximately 500 to 1500 milliseconds, for example. Moreover, H is supplied in the chamber with the oxidant, thus hydrogen atoms are contained in the aluminum oxide film formed in the process C more easily.

[Process D] The inner portion of the chamber of the deposition device is cleaned by the nitrogen gas, and the oxidant in the chamber is removed. At this time, the oxidant which has not contributed to a reaction at the time of forming the aluminum oxide at the atomic layer level on the substrate 1, for example, is removed. A length of time to clean the inner portion of the chamber with the nitrogen gas may be approximately 1 to several tens of seconds, for example.

Subsequently, the series of processes A to D is repeated several times, thus the aluminum oxide film having a desired film thickness (for example, approximately 10 to 200 nm) is formed.

Described herein is the case where aluminum oxide is formed using the TMA as the aluminum material, however, it goes without saying that the other material may be used as the aluminum material. For example, any material is applicable as long as it has an appropriate vapor pressure as a gas supply source (for example, 100 Pa or higher) at a material supply temperature (ranging from −20 to 120° C. as a preferred example) and can be supplied into the chamber in a gas state. Triethyl aluminum (TEA), for example, can be used as the aluminum material. The material which can be supplied in the gas state may be attenuated by adding nitrogen gas or carbon dioxide, for example, as a carrier gas to be supplied. A contained amount of the constituent element in the formed film can be appropriately adjusted by adjusting the types of the material gas and the carrier gas and a mixing ratio of those gases. The passivation layer 9 can be also easily formed on the entire periphery of the substrate 1 including the side surface 1c of the substrate 1 by using the ALD method. In the above case, only the first surface 1a and side surface 1c of the substrate 1 are dipped into hydrofluoric acid, for example. Alternatively, an acid-proof resist is applied on the passivation layer 9 located on the second surface 1b, and subsequently, an etching is performed using the hydrofluoric acid, for example. The unnecessary passivation layer 9 may be removed in the manner described above.

Figure 5E:
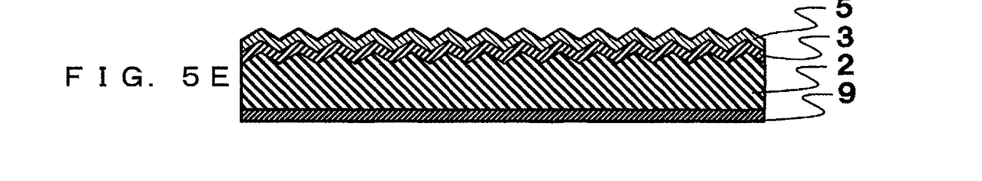

Next, as illustrated in FIG. 5E, the antireflection layer 5 made of the silicon nitride film is formed on the first surface 1a side of the substrate 1. The antireflection layer 5 is formed using the PECVD method or a sputtering method, for example. When the PECVD method is applied, the substrate 1 is previously heated at a higher temperature than a temperature in forming the film on the substrate 1. Subsequently, a mixed gas of silane ($SiH_4$) and ammonia ($NH_3$) is attenuated by adding nitrogen ($N_2$), and plasma is generated by a glow discharge decomposition with a reaction pressure of approximately 50 to 200 Pa to deposit the silicon nitride film on the heated substrate 1. The antireflection layer 5 is thereby formed on the substrate 1. A deposition temperature at this time is set to approximately 350 to 650° C. A frequency of 10 to 500 kHz is used as a frequency of a high-frequency power source necessary to perform the glow discharge. A gas flow rate is appropriately determined in accordance with a size of a reaction chamber, for example. For example, the gas flow rate preferably ranges from 150 to 6000 ml/min (sccm), and a flow ratio B/A of an ammonia flow rate B to a silane flow rate A preferably ranges from 0.5 to 15.

Figure 5F:
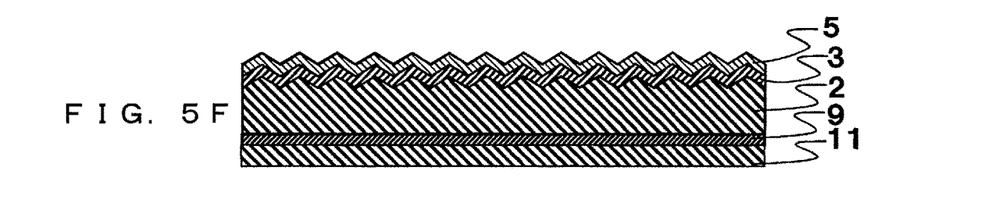

Next, the protective layer 11 is formed. As illustrated in FIG. 5F, the protective layer 11 is formed on the passivation layer 9. The protective layer 11 is formed as follows. Firstly, a silicon compound expressed by a general expression of $R_nSiX_{(4-n)}$ (R indicates an alkyl group, X indicates an alkoxy group, and n indicates one of integral numbers of 0 to 3) is adopted as a material. Herein, a carbon number of the alkyl group R is preferably approximately 1 to 20. The alkoxy group X includes a methoxy group, ethoxy group, and a propoxy group, for example. Such a silicon compound may be, for example, methyltribromsilane, methyltrimethoxysilane, methyltriethoxysilane, methyltriisopropoxysilane, ethyltribromsilane, ethyltrimethoxysilane, ethyltriethoxysilane, or ethyltriisopropoxysilane. Next, the silicon compound material is hydrolyzed, and subsequently a condensation polymerization is performed on the hydrolyzed silicon compound material to generate polysiloxane oligomer having a molecular weight of approximately 2000 to 6000.

This polysiloxane oligomer solution is applied on substantially an entire surface of the passivation layer 9 using a spray, roller, a die coater, a roll coater, a spin coater, or a screen printer, for example. Subsequently, the substrate 1 to which the polysiloxane oligomer solution is applied is dried at a temperature of approximately 100 to 300° C. for approximately 30 seconds to 20 minutes to be hardened. According to the above processes, the protective layer 11 including the polysiloxane layer can be formed.

As described above, the passivation layer 9 is not influenced by the plasma damage (an etching damage and a defect formation in the aluminum oxide film caused by a collision of electrons generated by the plasma and an impurity incorporation in the aluminum oxide film) at the time of forming the protective layer 11. Furthermore, the passivation layer 9 is not degraded by the influence of heat, thus adhesion strength of the passivation layer 9 attached to the substrate 1 is hardly reduced.

The following is the case of forming the protective layer 11 in which the polysiloxane layer dispersedly includes the silica particles 16 containing the plurality of silicon atoms. Prepared firstly is a silica dispersion liquid in which amorphous silica is dispersed in water or a compound liquid of water and alcohol by approximately 5 to 30% by mass. Then, the silicon compound material described above is added to the silica dispersion liquid by approximately 70 to 500% by mass, and the protective layer 11 can be thereby formed.

Figure 5G:
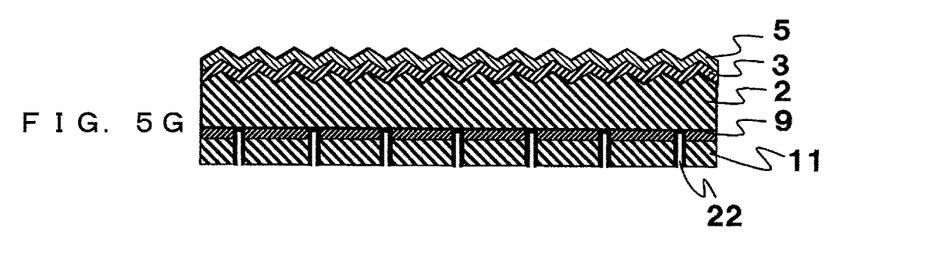

Next, as illustrated in FIG. 5G, the holes 22 which pass through both the passivation layer 9 and the protective layer 11 to reach the first semiconductor layer 2 is formed. The holes 22 may be formed by a laser beam irradiation, for example, or may also be formed by an etching or the like after forming a patterned etching mask. An Nd: YAG (neodymium-doped yttrium aluminum garnet) laser with Q switch (wavelength 1064 nm) or a second harmonic of the Nd: YAG laser (SHG, wavelength 532 nm) can be applied in forming the holes 22 by the laser beam irradiation. The holes 22 are circularly or linearly disposed in a planar view. When a connection conductor 12 has a circular shape, it is formed to have a diameter of approximately 30 to 150 μm, and approximately 100 to 500 connection conductors 12 are almost uniformly distributed per 1 cm².

Figure 5H:
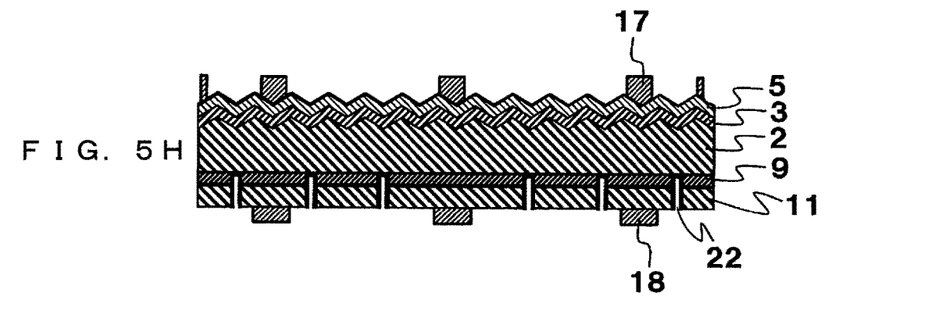
Figure 5I:
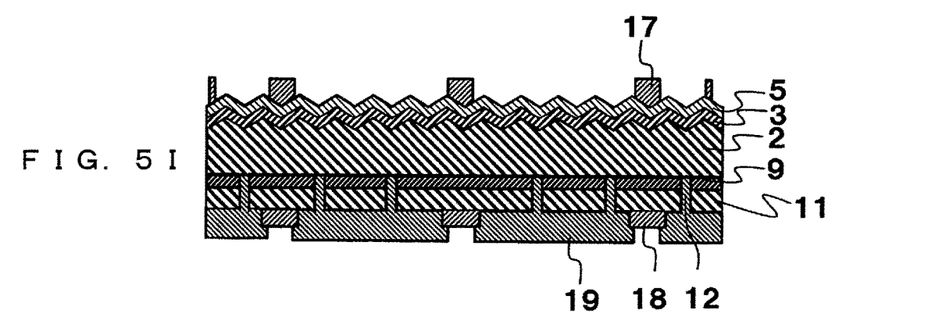

Next, a process of forming the electrodes is performed as illustrated in FIGS. 5H and 5I. The first electrode 6 (the first output extraction electrode 6a and the first power collection electrodes 6b), the second electrode 7, and the third electrode 8 are formed as follows.

Firstly, as illustrated in FIG. 5H, the first electrode 6 is formed using a first paste 17. The first paste 17 mainly contains at least one of silver and copper, for example, as a conductive component. In the above case, the conductive paste contains a metal powder of silver or the like (for example, having a particle diameter of approximately 0.05 to 20 pn or approximately 0.1 to 5 μm) so that the metal powder constitutes approximately 70 to 85% by mass of total mass of the conductive paste. The conductive paste into which a glass frit and an organic vehicle are mixed is used. The organic vehicle is obtained by adding a resin component used as a binder to an organic solvent, for example. An acrylic resin or an alkyd resin, for example, can be adopted as the binder as well as a cellulosic resin such as ethylcellulose. Adoptable as the organic solvent is, for example, diethylene glycol monobutyl ether acetate, terpineol, diethylene glycol monobutyl ether or the like. It is sufficient to contain the organic vehicle, approximately 5 to 20% by mass of the total mass of the conductive paste. A lead-based glass of $SiO_2$—$Bi_2O_3$—$PbO$ base or $Al_2O_3$—$SiO_2$—$PbO$ base, for example, as a glass material can be adopted as the constituent of the glass frit. A non-lead-base glass of $B_2O_3$—$SiO_2$—$Bi_2O_3$ base, $B_2O_3$—$SiO_2$—$ZnO$ base or the like can also be adopted as the other glass material. It is sufficient to contain the glass frit, approximately 2 to 15% by mass of the total mass of the conductive paste. Firstly, the first paste 17 is applied on the first surface 1a of the substrate 1 using a screen printing. After the first paste 17 is applied, the solvent is evaporated at a predetermined temperature and dried.

The second electrode 7 which is the electrode on the second surface 10b side is prepared using the conductive paste (a second paste 18) containing the metal powder mainly made of only silver, the organic vehicle, and the glass frit, for example. The constituent of the second paste 18 may be similar to that of the first paste 17. The screen printing method, for example, can be adopted as a method of applying the second paste 18. After the second paste 18 is applied, the solvent is evaporated at a predetermined temperature and dried.

Furthermore, as illustrated in FIG. 5I, the third electrode 8 is formed using a third paste 19. The third paste 19 used for forming the third electrode 8 mainly contains aluminum. In the above case, used for making the third paste 19 is the conductive paste which contains the aluminum powder (for example, having a particle diameter of approximately 0.05 to 20 μm or approximately 0.1 to 5 μm) so that the aluminum powder constitutes approximately 65 to 80% by mass of total mass of the conductive paste and into which the glass frit and the organic vehicle are mixed. The organic vehicle is obtained by adding a resin component used as a binder to an organic solvent, for example. An acrylic resin or an alkyd resin, for example, is adopted as the binder as well as a cellulosic resin such as ethylcellulose. Adopted as the organic solvent is, for example, diethylene glycol monobutyl ether acetate, terpineol, diethylene glycol monobutyl ether or the like. It is sufficient to contain the organic vehicle, approximately 5 to 30% by mass of the total mass of the conductive paste. A lead-based glass of $SiO_2$—$Bi_2O_3$—$PbO$ base, $Al_2O_3$—$SiO_2$—$PbO$ base or the like, for example, can be adopted to the glass frit. A non-lead-base glass of $B_2O_3$—$SiO_2$—$Bi_2O_3$ base, $B_2O_3$—$SiO_2$—ZnO base or the like can also be adopted to the glass frit. It is sufficient to contain the glass frit in the conductive paste by approximately 2 to 15% by mass. The third paste 19 is applied to overlap the outer peripheral portion of the second paste 18, which has been applied already, and cover substantially the entire surface of the protective layer 11 except for the outer peripheral portion ranging approximately 0.3 to 2 mm from the end portion of the substrate 1. The screen printing method, for example, can be used as a method of applying the third paste 19. The inner portion of the connection conductor 12 is also filled with the third paste 19 by applying the third paste 19. After the third paste 19 is applied, the solvent may be evaporated at a predetermined temperature and dried.

Subsequently, the substrate 1 on which the first paste 17, the second paste 18, and the third paste 19 are applied is baked in a baking furnace at a temperature of approximately 700 to 900° C. at a maximum, keeping the maximum temperature for approximately 0.1 to several tens of seconds. Accordingly, each conductive paste is sintered, and the first electrode 6, the second electrode 7, and the third electrode 8 are thereby formed as illustrated in FIG. 3. The first paste 17 passes through the antireflection layer 5 by the baking, and is connected to the n-type second semiconductor layer 3 located on the first surface 1a of the substrate 1, and thus the first electrode 6 is formed. The third paste 19 is also connected to the p-type first semiconductor layer 2 located on the second surface 1b at the end portion of the connection conductor 12, and thus the third electrode 8 is formed. The BSF layer 4 is also formed in accordance with the formation of the third electrode 8. Furthermore, the second paste 18 is also sintered, and thereby the second electrode 7 is formed. However, the second paste 18 and the third paste 19 located on the protective layer 11 are blocked by the protective layer 11, thus the passivation layer 9 is hardly influenced. The protective layer 11 containing polysiloxane containing the alkyl group can reduce the damage on the passivation layer 9 caused by baking the conductive paste even when the protective layer 11 has a small thickness of 0.1 to 5 µm, for example. When the conductive paste is baked, the polysiloxane layer contains at least one of the carboxyl group and the carbonate group as described above. Accordingly, the solar cell element 10 which is superior in terms of weatherability with high efficiency can be achieved.

An embodiment is not limited to the contents described above. For example, the passivation layer 9 may be formed before forming the antireflection layer 5, and the passivation layer 9 may be located above or below the antireflection layer 5. Moreover, in the processes of forming the electrodes, it is also applicable to bake the first paste and the second paste for forming the first electrode 6 and the second electrode 7 including the similar constituents, and subsequently bake the third paste for forming the third electrode 8 separately.

<Another Embodiment>

Next, another embodiment is described. The description of the configuration common to that of an embodiment described above is omitted.

In an embodiment described above the protective layer 11 may further include a silica ($SiO_2$) layer. For example, the protective layer 11 is made up of the polysiloxane layer, the silica layer, and the like. The protective layer 11 has a laminated structure in which the silica layer is located on at least one of a first surface and second surface (an opposite surface of the first surface) of the polysiloxane layer. In the above case, even when the polysiloxane layer includes a pinhole or a portion with small thickness, the silica layer can make up the pinhole and the portion. Accordingly, the reliability of the solar cell element 10 can be enhanced. The polysiloxane layer and the silica layer may be located side by side.

Figure 6A:
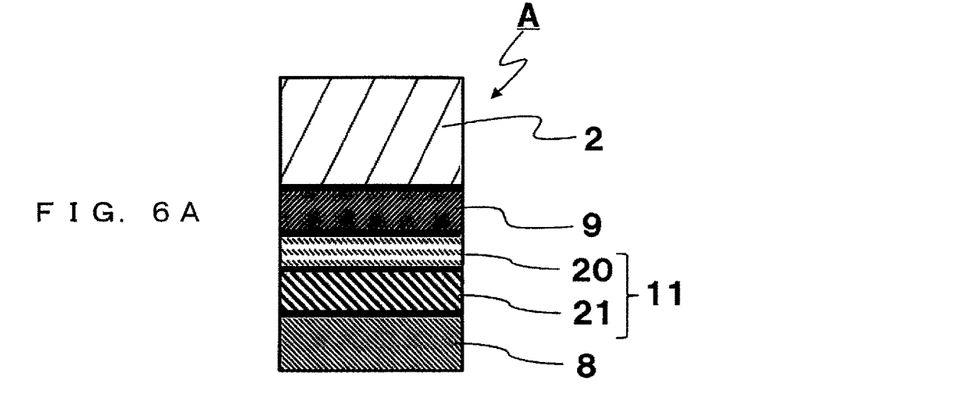
FIGS. 6A to 6C illustrate cross-sectional views each showing an example of a part A in FIG. 3.

The silica layer 20 in the protective layer 11 may be in contact with the passivation layer 9. For example, as illustrated in FIG. 6A, the protective layer 11 may include a silica layer 20 located on the passivation layer 9 and a polysiloxane layer 21 located on the silica layer 20. The silica layer 20 may be in contact with the passivation layer 9 at the first surface and in contact with the polysiloxane layer 21 at the second surface so that the polysiloxane layer 21 may not be in direct contact with the passivation layer 9. The change in properties of the passivation layer 9 due to the influence of the moisture contained in polysiloxane oligomer at the time of forming the polysiloxane layer 21 (the change from aluminum oxide to aluminum hydroxide, for example) can be reduced. Accordingly, the photoelectric conversion efficiency of the solar cell element 10 can be enhanced.

The silica layer 20 is formed using the ALD method which is superior in terms of the coverage, for example. The layer can be deposited by the ALD method, using, for example, a silicon material such as Bis(diethylamino)silane (BDEAS) or N, N, N', N', tetraethylsilane diamine gas, ozone ($O_3$) or water vapor, and the like as material gases.

Herein, the silica layer 20 preferably has a film thickness smaller than the passivation layer 9. Accordingly, a negative fixed charge of the aluminum oxide constituting the passivation layer 9 becomes dominant over a positive fixed charge of the silica layer 20, thus the passivation effect of the passivation layer 9 is hardly reduced. The film thickness of the silica layer 20 in the above case may be approximately 8 to 190 nm.

Figure 6B:
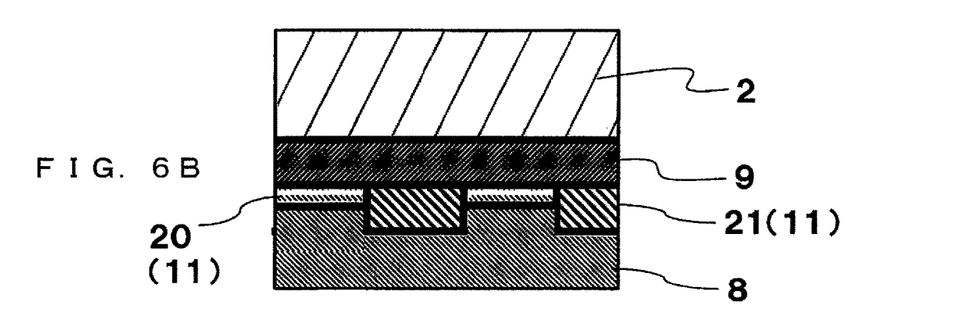

As illustrated in FIG. 6B, the silica layer 20 and the polysiloxane layer 21 may be alternately arranged in a direction parallel to a main surface of the passivation layer 9. The silica layer 20 is thinner than the polysiloxane layer 21. Thus, the aluminum of the third electrode 8 partially passes through the silica layer 20 and the passivation layer 9 by the baking, thereby being easily connected to the first semiconductor layer 2. Accordingly, the number of the connection conductors 12 passing through the passivation layer 9 and the protective layer 11 can be reduced, and the formation of the connection conductor 12 can be omitted, thus the number of manufacturing processes can be reduced.

The protective layer 11 illustrated in FIG. 6B can be formed by a method described below, for example. After the silica layer 20 is deposited on substantially the entire surface of the passivation layer 9, the silica layer 20 is partially etched and removed using a photolithography method, for example. Subsequently, polysiloxane oligomer may be applied on the portion from which the silica layer 20 is removed using the screen printing, for example, and then, dried and hardened.

Figure 6C:
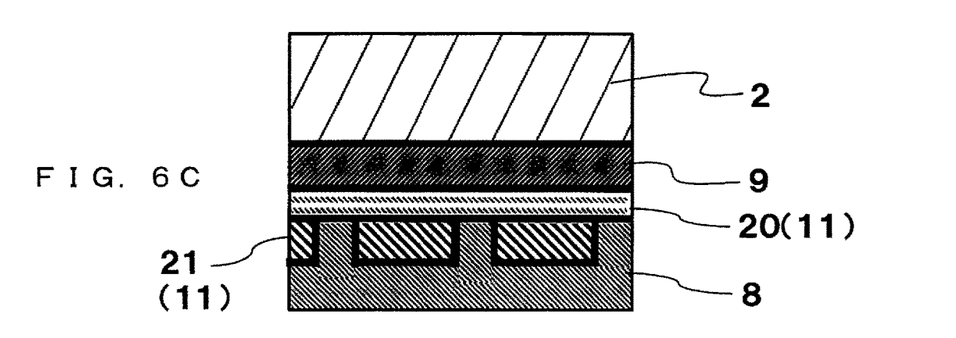

The protective layer 11 illustrated in FIG. 6C includes the polysiloxane layer 21 which is partially missing on the silica layer 20. Such a polysiloxane layer 21 can be formed by a method described below, for example. The silica layer 20 is deposited on substantially the entire surface of the passivation layer 9. Subsequently, the polysiloxane layer 21 which is partially missing is formed on the silica layer 20 using the screen printing method. For example, polysiloxane oligomer is applied on a predetermined pattern using the screen printing method or the like, and then, dried and hardened. In the above case, the third electrode 8 is also formed on the portion where the polysiloxane layer 21 is partially missing at the time of forming the third electrode 8. Then, aluminum which is the constituent of the third electrode 8 passes through the silica layer 20 and the passivation layer 9 by the baking at the time of forming the third electrode 8, thus the third electrode 8 is partially connected to the first semiconductor layer 2. Accordingly, the number of the connection conductors 12 passing through the passivation layer 9 and the protective layer 11 can be reduced, and the processes of forming the holes can be omitted, thus the number of manufacturing processes can be reduced.

It is also applicable that a metal layer is further provided to cover the protective layer 11, and the silica layer 20 in the protective layer 11 is in contact with the metal layer. For example, the metal layer is the third electrode 8 mainly containing aluminum, and the third electrode 8 is formed to cover substantially the entire surface of the protective layer 11 as described above.

Figure 7:
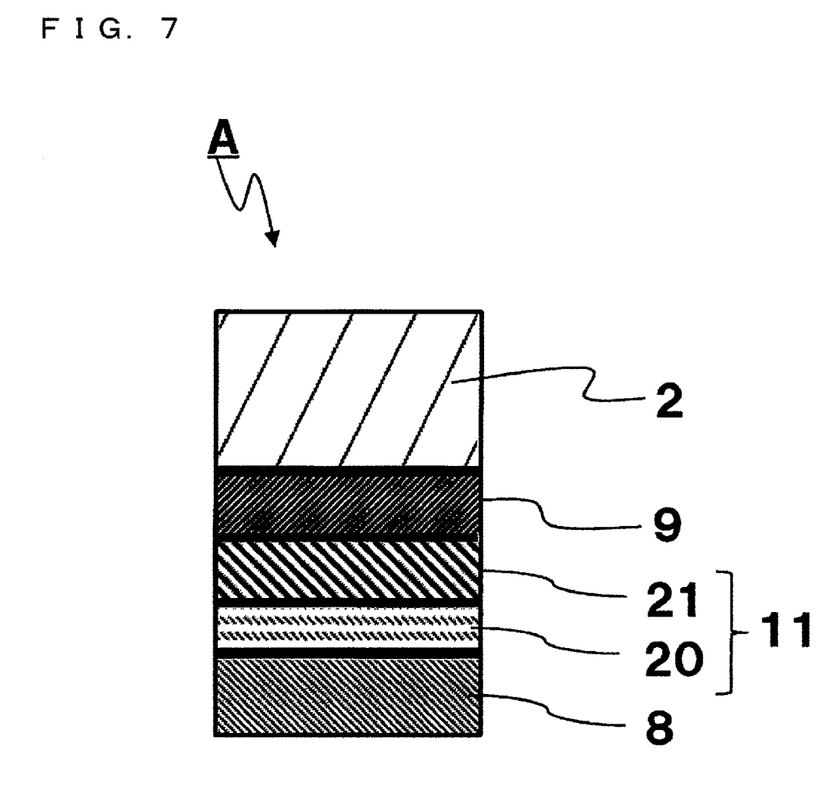
FIG. 7 illustrates a cross-sectional view showing another example of the part A in FIG. 3.

It is moreover applicable that one surface of the silica layer 20 in the protective layer 11 is in contact with the third electrode 8 and the other surface is in contact with the polysiloxane layer 21 as illustrated in FIG. 7. Accordingly, the silica layer 20 and the glass frit which is one of the constituents of the third electrode 8 can be reacted by the baking. Adhesion strength is enhanced compared with the case where the metal layer is in direct contact with the polysiloxane layer 21, thus the reliability of the solar cell element 10 can be further enhanced.

Practical Example

<Preparation of Solar Cell Element According to Practical Example>

The solar cell element 10 according to a practical example was prepared as follows.

As illustrated in FIG. 5A, a p-type polycrystalline silicon substrate doped with boron was prepared as the substrate 1. The substrate 1 was obtained by slicing the ingot of the polycrystalline silicon prepared by the casting method. The substrate 1 as prepared had a specific resistance value of approximately 1 Ω·cm, a thickness of approximately 200 μm, and a planar square shape having a length of approximately 156 mm in each side As illustrated in FIG. 5B, the substrate 1 was etched to a depth of 7 to 12 μm from the surface thereof using NaOH solution. Subsequently, a minute texture was formed on the first surface 1a side of the substrate 1 by RIE.

Then, an n-type region was formed on the entire surface of the substrate 1 by a gas-phase thermal diffusion method in which phosphorus oxychloride functions as a diffusion source. The n-type region was formed to have a sheet resistance value of approximately 60 to 100Ω/□. Subsequently, only the second surface 1b and side surface 1c of the substrate 1 were dipped into a mixed solution of hydrofluoric acid and nitric acid to remove the n-type region formed on the second surface 1b and the side surface 1c. Furthermore, the remaining PSG was removed by a hydrofluoric acid solution. Accordingly, as illustrated in FIG. 5C, the n-type second semiconductor layer 3 was formed on the first surface 1a of the substrate 1.

Next, the passivation layer 9 made of aluminum oxide was formed on the entire surface of the substrate 1 to have a thickness of approximately 10 to 20 nm by the ALD method. The passivation layer 9 was formed in a state where the substrate 1 was held upright in a chamber of an ALD device and a temperature of the substrate 1 was kept to approximately 200° C. under reduced pressure. In the ALD method, TMA was used as a material gas, and $N_2$, He, and $H_2$ were used as a carrier gas and a purge gas. Ozone was used as an oxidized gas.

The passivation layer 9 was deposited by repeating a cycle of the process A to the process D several times using the ALD device. A time required for each process of the process A to the process D described above per cycle was as follows: approximately four seconds for the process A, approximately five seconds for the process B, approximately one second for the process C, and approximately five seconds for the process D. Then a deposition time (the number of cycles) was determined in accordance with a deposition rate which was previously calculated.

Subsequently, only the first surface 1a and side surface 1c were dipped into the hydrofluoric acid solution. The passivation layer 9 on the first surface 1a and the side surface 1c were thereby removed, and the passivation layer 9 was formed on the second surface 1b as illustrated in FIG. 5D.

Next, as illustrated in FIG. 5E, the antireflection layer 5 made up of the silicon nitride film having a refraction index of approximately 1.9 to 2.1 and a thickness of approximately 70 to 90 nm was formed on the first surface 1a of the substrate 1 by the PECVD method. In a chamber at a temperature of approximately 500° C., the mixed gas of silane and ammonia was attenuated with nitrogen, and plasma was generated by the glow discharge decomposition, thereby the silicon nitride was deposited to form the antireflection layer 5.

Subsequently, as illustrated in FIG. 5F, the protective layer 11 was formed on the passivation layer 9. The protective layer 11 according to a practical example was formed as follows. Prepared firstly was the silicon compound material having a structure of $R_nSiX_{(4-n)}$ (R indicates a methyl group, X indicates a methoxy group, and n indicates one of integral numbers of 0 to 3). Next, the silicon compound material was hydrolyzed, and subsequently a condensation polymerization was performed on the hydrolyzed silicon compound material to generate polysiloxane oligomer having a molecular weight of approximately 3000 to 5000.

This polysiloxane oligomer solution was applied on substantially the entire surface of the passivation layer 9 using a roll coater. Subsequently, the substrate 1 to which the polysiloxane oligomer solution was applied was dried at a temperature of approximately 250° C. for approximately 10 minutes. According to the above processes, the protective layer 11 including the polysiloxane layer having the alkyl group could be formed. The film thickness of the protective layer 11 was approximately 3 to 5 μm.

Next, the connection conductor 12 was formed as illustrated in FIG. 5G. The connection conductor 12 was formed with the laser beam irradiation using a laser equipment using the second harmonic of the Nd: YAG laser. The connection conductor 12 is formed to have a circular shape with a diameter of approximately 90 to 110 μm in a planar view, and approximately 300 connection conductors 12 were formed to be uniformly distributed per 1 $cm^2$.

Next, as illustrated in FIG. 5H, the first paste 17 was applied on the first surface 1a of the substrate 1 using the screen printing method. The first paste 17 as used mainly contained silver. The conductive paste contained a metal powder of silver (metal silver particles each having a particle diameter of approximately 0.1 to 5 μm were mixed) so that the metal powder constituted approximately 87% by mass of total mass of the conductive paste. In an organic vehicle, ethylcellulose was used as a binder, and diethylene glycol monobutyl ether was used as an organic solvent. The conductive paste contained the organic vehicle, approximately 10% by mass of the total mass of the conductive paste. A lead-based glass of $SiO_2$—$Bi_2O_3$—PbO base as a glass material was used as the glass frit, and the conductive paste contained the glass frit, approximately 3% by mass of the total mass of the conductive paste. After the first paste 17 was applied, the substrate 1 was heated at a temperature of approximately 90° C. for approximately thirty minutes to dry the applied paste. The first electrode 6 formed by the application of the first paste 17 had a thickness of 12 to 15 µm after the baking.

Next, the second paste 18 was applied on the second surface 10b using the screen printing method. The constituent of the second paste 18 was similar to that of the first paste 17. After the second paste 18 is applied, the substrate 1 was heated at a temperature of approximately 90° C. for approximately thirty minutes to dry the applied paste. The second electrode 7 formed by the application of the second paste 18 had a thickness of approximately 12 to 15 µm after the baking.

Next, as illustrated in FIG. 5I, the third paste 19 was applied on the second surface 10b using the screen printing method. The third paste 19 mainly contained aluminum. In this case, the conductive paste contained an aluminum powder (aluminum particles each having a particle diameter of approximately 0.3 to 8 µm were mixed) so that the aluminum powder constituted approximately 70% by mass of total mass of the conductive paste. In an organic vehicle, ethylcellulose was used as a binder, and diethylene glycol monobutyl ether was used as an organic solvent. The conductive paste contained the organic vehicle, approximately 27% by mass of the total mass of the conductive paste. A lead-based glass of $SiO_2$—$Bi_2O_3$—PbO base as a glass material was used as the glass frit, and the conductive paste contained the glass frit, approximately 3% by mass of the total mass of the conductive paste. After the first paste 17 was applied, the substrate 1 was heated at a temperature of approximately 90° C. for approximately thirty minutes to dry the applied paste. The third electrode 8 formed by the application of the third paste 19 had a thickness of 17 to 23 µm after the baking.

Subsequently, the substrate 1 on which the first paste 17, the second paste 18, and the third paste 19 were applied was baked in a baking furnace at a temperature of approximately 850° C. at a maximum, keeping the maximum temperature for approximately ten seconds. The 30 solar cell elements 10 according to a practical example were prepared in this manner.

<Preparation of Solar Cell Element According to Comparison Example>

Processes of preparing the solar cell element according to a comparison example illustrated in FIG. 5A to FIG. 5E were similar to those of a practical example described above.

Subsequently, as illustrated in FIG. 5F, the protective layer 11 was formed on the passivation layer 9. The protective layer 11 according to the comparison example was prepared as follows so that the protective layer 11 includes the polysiloxane layer which did not contain the alkyl group.

Prepared firstly was the silicon compound material having a structure of $SiX_4$ (X indicates a methoxy group). Next, the silicon compound material was hydrolyzed, and subsequently a condensation polymerization was performed on the hydrolyzed silicon compound material. Polysiloxane oligomer having a molecular weight of approximately 3000 to 5000 was thereby generated.

This polysiloxane oligomer solution was applied on substantially the entire surface of the passivation layer 9 using a roll coater. Subsequently, the substrate 1 to which the polysiloxane oligomer solution was applied was heated at a temperature of approximately 250° C. and dried for approximately 10 minutes. According to the above processes, the protective layer 11 including the polysiloxane layer which did not contain the alkyl group could be formed. The film thickness of the protective layer 11 was approximately 3 to 5 µm.

Subsequently, the processes illustrated in FIG. 5G to FIG. 5I, which were similar to the processes of preparing the solar cell element according to a practical example described above, are performed. The 30 solar cell elements 10 according to the comparison example were prepared in this manner.

<Analysis of Protective Layer>

An analysis sample was prepared from the completed solar cell element 10 according to a practical example described above and the comparison example. The analysis sample is obtained by removing approximately 1 cm$^2$ of the third electrode 8 near a central portion on the second surface 10b side of each solar cell element by an abrasive operation to expose the protective layer 11.

The region from which the protective layer 11 was exposed in the analysis sample was analyzed by FT-IR. As a result, a peak which indicates a bond between silicon and the methyl group (Si—$CH_3$) was confirmed in the solar cell element according to a practical example described above. It was also confirmed that the protective layer 11 according to a practical example described above included the polysiloxane layer having the alkyl group (the methyl group in a practical example described above). In contrast, a peak of the alkyl group was not confirmed in the solar cell element according to the comparison example.

A peak which indicated a presence of the methoxy group was not seen regarding the protective layer 11 according to any of a practical example described above and the comparison example. It is considered that the methoxy group contained in the silicon compound material disappears due to the decomposition and the desorption caused by the hydrolysis reaction and the condensation polymerization reaction at the time of generating polysiloxane oligomer, a drying after applying the polysiloxane oligomer solution on the passivation layer 9, and a thermal treatment at the time of baking the electrodes, for example.

<Reliability Test>

The reliability test was performed on 25 solar cell elements according to a practical example described above and the comparison example for each. Firstly, a voltage-current curve for each solar cell element was measured with a solar simulator emitting light of AM1.5 and 100 mW/cm$^2$ in conformity with JIC C 8913. An average value of initial fill factors (FFs) was obtained from the curves.

Subsequently, each solar cell element according to a practical example described above and the comparison example was put in a constant temperature and humidity test apparatus with a temperature of 95° C. and a humidity of 95%. An output measurement similar to that in the above description was performed after an elapse of 200 hours, 500 hours, 800 hours, and 1000 hours from a time when each solar cell element was put in the constant temperature and humidity test apparatus, and the average value of maintenance rates of FFs for each elapse of time was calculated. The maintenance rate of FF indicates a maintenance rate for each elapse of time in a case where the initial FF value is defined as 100%.

TABLE 1

| | FF maintenance rate (%) | | | |
|---|---|---|---|---|
| | 200 hours | 500 hours | 800 hours | 1000 hours |
| Practical Example | 99 | 97 | 96 | 96 |
| Comparison Example | 98 | 96 | 94 | 93 |

It was confirmed from these results that the solar cell element according to a practical example described above particularly had the higher maintenance rate of FF than the solar cell element according to the comparison example. Confirmed therefore was the effect of enhancing the reliability of the solar cell element 10 due to the fact that the polysiloxane layer contained the alkyl group.

REFERENCE SIGNS LIST

1: silicon substrate
1a: first surface
1b: second surface
1c: side surface
2: first semiconductor layer (p-type semiconductor region)
3: second semiconductor layer (n-type semiconductor region)
4: BSF layer
5: antireflection layer
6: first electrode
6a: first output extraction electrode
6b: first power collection electrode
7: second electrode
8: third electrode
9: passivation layer
10: solar cell element
10a: first surface
10b: second surface
10c: side surface
11: protective Layer
12: connection conductor
20: silica layer
21: polysiloxane layer

The invention claimed is:

1. A solar cell element, comprising:
a semiconductor substrate including a p-type semiconductor region on one surface side thereof;
a passivation layer located on the p-type semiconductor region and containing aluminum oxide;
a protective layer located on the passivation layer and including a polysiloxane layer that contains an alkyl group; and
at least one electrode located on the protective layer opposite the passivation layer, wherein the at least one electrode covers substantially an entire surface of the protective layer and fills a plurality of holes passing through the protective layer and the passivation layer so as to be in direct contact with the semiconductor substrate, and wherein
the polysiloxane layer further contains silica particles.

2. The solar cell element according to claim 1, wherein the protective layer has a thickness of 0.1 μm to 10 μm.

3. The solar cell element according to claim 1, wherein the protective layer further includes a silica layer.

4. The solar cell element according to claim 3, wherein the silica layer in the protective layer is in contact with the passivation layer.

5. The solar cell element according to claim 3, further comprising
a metal layer covering the protective layer, wherein the silica layer in the protective layer is in contact with the metal layer.

6. The solar cell element according to claim 3, wherein the silica layer is located between the passivation layer and the polysiloxane layer.

7. The solar cell element according to claim 3, wherein the silica layer is thinner than the polysiloxane layer.

8. The solar cell element according to claim 1, wherein the polysiloxane layer contains at least one of a carboxyl group and a carbonate group.

9. The solar cell element according to claim 1, wherein an average particle diameter of the silica particles is 20 nm to 200 nm.

10. A method of manufacturing a solar cell element, comprising:
forming a passivation layer including aluminum oxide on a p-type semiconductor region of a semiconductor substrate which includes the p-type semiconductor region on one surface side of the semiconductor substrate;
forming a coating film that includes polysiloxane oligomer and silica particles on the passivation layer, and drying the coating film to form a protective layer that includes a polysiloxane layer containing an alkyl group and silica particles; and
forming at least one electrode located on the protective layer opposite the passivation layer, wherein the at least one electrode covers substantially an entire surface of the protective layer and fills a plurality of holes passing through the protective layer and the passivation layer so as to be in direct contact with the semiconductor substrate.

11. The method of manufacturing the solar cell element according to claim 10, further comprising
forming a silica layer on the passivation layer after forming the passivation layer and before forming the coating film.

12. The method of manufacturing the solar cell element according to claim 10, further comprising
oxidizing part of the alkyl group contained in the polysiloxane layer so that the polysiloxane layer contains at least one of a carboxyl group and a carbonate group.

13. The method of manufacturing the solar cell element according to claim 10, wherein the polysiloxane layer is formed by a screen printing method.

14. The method of manufacturing the solar cell element according to claim 10, wherein the passivation layer is formed by an ALD method.

* * * * *